United States Patent
Hiromatsu et al.

(10) Patent No.: US 9,927,697 B2
(45) Date of Patent: Mar. 27, 2018

(54) MASK BLANK, METHOD OF MANUFACTURING MASK BLANK AND METHOD OF MANUFACTURING TRANSFER MASK

(71) Applicant: HOYA CORPORATION, Tokyo (JP)

(72) Inventors: Takahiro Hiromatsu, Tokyo (JP); Masahiro Hashimoto, Tokyo (JP)

(73) Assignee: HOYA CORPORATION, Tokyo (JP)

(*) Notice: Subject to any disclaimer, the term of this patent is extended or adjusted under 35 U.S.C. 154(b) by 136 days.

(21) Appl. No.: 14/906,820

(22) PCT Filed: Aug. 1, 2014

(86) PCT No.: PCT/JP2014/070318
§ 371 (c)(1),
(2) Date: Jan. 21, 2016

(87) PCT Pub. No.: WO2015/029693
PCT Pub. Date: Mar. 5, 2015

(65) Prior Publication Data
US 2016/0161844 A1 Jun. 9, 2016

(30) Foreign Application Priority Data
Aug. 28, 2013 (JP) .................................. 2013-177137

(51) Int. Cl.
*G03F 1/48* (2012.01)

(52) U.S. Cl.
CPC ...................................... *G03F 1/48* (2013.01)

(58) Field of Classification Search
CPC ..... G03F 1/20; G03F 1/40; G03F 1/48; G03F 1/78; G03F 7/0382; G03F 7/0392
(Continued)

(56) References Cited

U.S. PATENT DOCUMENTS

2001/0016300 A1 8/2001 Iwata et al.
2002/0006555 A1 1/2002 Hasegawa et al.
(Continued)

FOREIGN PATENT DOCUMENTS

JP 2001-230189 A 8/2001
JP 2002-023340 A 1/2002
(Continued)

OTHER PUBLICATIONS

Mar. 1, 2016 International Preliminary Report on Patentability issued in International Patent Application No. PCT/JP2014/070318.
(Continued)

*Primary Examiner* — John A McPherson
(74) *Attorney, Agent, or Firm* — Oliff PLC (57) ABSTRACT

Provided is a mask blank, including: a resist layer formed by a chemically amplified resist; a protective layer formed to coat the resist layer; and a buffer layer provided between the resist layer and the protective layer, wherein the protective layer contains an acidic substance, a basic substance, and a salt generated by a reaction between the acidic substance and the basic substance, and the buffer layer has a portion which is a surface layer portion of a pre-coated resist layer before being coated by the protective layer, and in which the pre-coated resist layer and the protective layer 4 are in contact with each other, and this portion is formed by receiving the acidic substance, the basic substance, and the salt moved from the protective layer 4.

16 Claims, 7 Drawing Sheets

(58) Field of Classification Search
USPC .............................................................. 430/5
See application file for complete search history.

(56) References Cited

U.S. PATENT DOCUMENTS

2004/0265706 A1* 12/2004 Montgomery ........ G03F 7/0045
430/5
2005/0277065 A1    12/2005 Hasegawa et al.
2006/0121359 A1     6/2006 Kobayashi

FOREIGN PATENT DOCUMENTS

| JP | 2002-373832 A  | 12/2002 |
| JP | 2005-352180 A  | 12/2005 |
| JP | 2007-525714 A  | 9/2007  |
| WO | 2004/088419 A1 | 10/2004 |
| WO | 2005/083514 A2 | 9/2005  |

OTHER PUBLICATIONS

Sep. 9, 2014 Search Report issued in International Patent Application No. PCT/JP2014/070318.

* cited by examiner

Fig. 7

MASK BLANK, METHOD OF MANUFACTURING MASK BLANK AND METHOD OF MANUFACTURING TRANSFER MASK

BACKGROUND

Technical Field

The present invention relates to a mask blank, a method of manufacturing a mask blank and a method of manufacturing a transfer mask.

Description of Related Art

The mask blank is used as a base of a transfer mask used in a photolithography method, and the transfer mask is used for a formation of a semiconductor pattern.

As the semiconductor pattern becomes finer, a pattern of the transfer mask used for the formation of the pattern becomes also finer. The transfer mask is manufactured by forming a thin film formed on the mask blank, into a previously set pattern shape.

In the mask blank, it is a resist layer formed on the thin film, that should be pattern-formed first. Therefore, a subject of the present invention is to form a fine pattern with high sensitivity in patterning of the resist layer. As a result, as a resist used when manufacturing the mask blank, a chemically amplified resist with high sensitivity to an exposure light, has been used.

Then, regarding the mask blank and the chemically amplified resist, each document discloses that there are following two points to be improved.

A first point is that when the mask blank is stored or transferred, foreign matters are adhered to an outermost surface of the mask blank.

A second point is that when exposed to an outside air, a contaminant in the outside air is adhered or the chemically amplified resist itself is deteriorated, and the sensitivity cannot be maintained.

In order to improve the above two points, an applicant of the present application discloses a technique of forming a dust-proof protective film made of a water-soluble resin on the chemically amplified resist layer (see patent document 1).

PRIOR ART DOCUMENT

Patent Document

Patent Document 1: WO2004/088419

SUMMARY OF THE INVENTION

Problem to be Solved by the Invention

As a method of solving the above two problems, first, the following point can be given. Namely, a protective film is formed on the chemically amplified resist layer. However, regarding the formation of the protective layer on the chemically amplified resist layer, the following point is found by the inventors of the present invention as a new problem.

Namely, as a third point, when the protective layer is formed on the chemically amplified resist layer, the sensitivity of the chemically amplified resist layer is reduced due to a component such as acids and bases contained in the protective layer, or moisture and outgas penetrated through the protective layer.

Further, in addition to the above points, the inventors of the present invention find the following point as a new problem.

As a fourth point, when the constitution disclosed in patent document 1 is employed, adhesion between the chemically amplified resist layer and the protective layer is required to be maintained to be high. As described above, the semiconductor pattern becomes finer, and a micro-size or nano-size pattern is required. In such a fine pattern formation, the chemically amplified resist layer and the protective layer are adhered to each other at a certain part, and meanwhile when the protective layer is separated from the chemically amplified resist layer at the other part, an uneven place is generated on a main surface of the mask blank. There is a possibility that such an uneven place is an inhibition factor of the fine pattern formation.

As a fifth point, when exposure is performed to the chemically amplified resist layer, there is a possibility that a property of the exposed portion on the main surface of the chemically amplified resist layer is changed. As an example, the following case is considered. Namely, a spot exposure of a diameter of several tens nm is performed to the chemically amplified resist. In this case, the exposure is performed to the chemically amplified resist layer, and the protective layer is removed, and thereafter the chemically amplified resist layer is coated with a developing solution. Originally, a hole with a diameter of several tens nm must be formed. Namely, the developing solution must enter into the hole with a diameter of several tens nm. If the property of the exposed part is changed, the developing solution cannot satisfactorily enter into the exposed part which is a spot with a diameter of several tens nm, thus involving a problem that the fine resist pattern cannot be formed.

Therefore, a main object of the present invention is to provide the mask blank capable of protecting the chemically amplified resist layer from foreign matters by the protective film, maintaining a function as a chemically amplified resist, and forming a fine pattern.

Means for Solving the Problem

The inventors of the present invention examine a technique of solving the abovementioned problems. First, in order to solve the first and second points, as described in the patent document 1, the inventors of the present invention consider it better to follow the constitution of forming the protective layer so as to coat the chemically amplified resist layer. However, there is still a necessity for solving the third to fifth points.

Therefore, the inventors of the present invention further examine a means for solving the third point. It is natural to consider that a component such as acids or bases contained in the protective layer should be shielded before it enters into the chemically amplified resist layer. However, the inventors of the present invention achieve a completely opposite concept to such an idea, which is a concept that a component contained in the protective layer is intentionally invaded into the chemically amplified resist layer. Then, the inventors of the present invention achieve a breakthrough method of changing a portion of the chemically amplified layer to a buffer layer, the portion being included in the protective layer and into which the component is invaded, and by this buffer layer, suppressing an excessive invasion of the acids or bases contained in the protective layer, and the invasion of a moisture or an outgas, etc., permeated through the protective layer. Although a detailed explanation will be given hereafter, thus, it is found by the inventors of the present invention, that fourth and fifth points can be solved similarly to the third point.

Constitutions of the present invention based on the above-mentioned knowledge are as follows.

According to a first constitution, there is provided a mask blank, including:
  a resist layer formed by a chemically amplified resist;
  a protective layer formed to coat the resist layer; and
  a buffer layer provided between the resist layer and the protective layer,
  wherein the protective layer contains an acidic substance, a basic substance, and a salt generated by a reaction between the acidic substance and the basic substance, and
  the buffer layer has a portion which is a surface layer portion of a pre-coated resist layer before being coated by the protective layer, and in which the pre-coated resist layer and the protective layer are in contact with each other, and
  this portion contains the acidic substance, the basic substance, and the salt.

According to a second constitution, there is provided the mask blank of the first constitution, wherein the resist layer contains the basic substance, and the basic substance of the protective layer is more bulky than the basic substance of the resist layer.

According to a third constitution, there is provided the mask blank of the first constitution, wherein the resist layer contains the basic substance, and a molecule of the basic substance of the protective layer is larger than a molecule of the basic substance of the resist layer.

According to a fourth constitution, there is provided the mask blank of any one of the first to third constitutions, wherein the acidic substance of the protective layer is an aromatic compound.

According to a fifth constitution, there is provided the mask blank of any one of the first to fourth constitutions, wherein the basic substance of the protective layer is amine.

According to a sixth constitution, there is provided the mask blank of any one of the first to fifth constitutions, wherein a thickness of the buffer layer is 10 nm or less.

According to a seventh constitution, there is provided the mask blank of any one of the first to sixth constitutions, wherein the protective layer is soluble in one of water or an alkaline solution, or in both of them.

According to an eighth constitution, there is provided the mask blank of any one of the first to seventh constitutions, wherein the buffer layer is soluble in one of water or an alkaline solution, or in both of them.

According to a ninth constitution, there is provided a method of manufacturing a mask blank, including:
  forming a protective layer containing an acidic substance, a basic substance, and a salt generated by a reaction between the acidic substance and the basic substance, so as to coat a resist layer formed by a chemically amplified resist; and
  forming a buffer layer between the resist layer and the protective layer by receiving the acidic substance, the basic substance, and the salt moved from the protective layer, at a portion which is a surface layer portion of a pre-coated resist layer before being coated by the protective layer and in which the pre-coated resist layer and the protective layer are in contact with each other, during or after forming the protective layer.

According to a tenth constitution, there is provided a method of manufacturing a transfer mask, including forming a pattern of a size of 200 nm or less, for the mask blank of any one of the first to eighth constitutions.

Advantage of the Invention

According to the present invention, there is provided a mask blank capable of protecting a chemically amplified resist layer from a foreign matter by a protective layer, and maintaining a function as a chemically amplified resist, and forming a fine pattern.

DETAILED DESCRIPTION OF THE INVENTION

Embodiment 1

Embodiments of the present invention will be described hereafter using mainly FIGS. 1 to 5. In this embodiment, explanation is given in the following order.
1. Mask blank
  1-A) Outline
  1-B) Substratum
    1-B-1) Substrate
    1-B-2) Thin film
  1-C) Chemically amplified resist layer
  1-D) Buffer layer
  1-E) Protective layer
  1-F) Other
2. Method of manufacturing a mask blank
  2-A) Substratum preparing step
  2-B) Chemically amplified resist layer forming step
  2-C) Protective layer forming step
  2-D) Buffer layer forming step
3. Transfer mask and manufacturing method of the same
4. Effect of this embodiment
5. Modified example Regarding a content not described below, a publicly-known constitution (for example, constitution described in patent document 1) of a technique regarding a mask blank, a method of manufacturing a mask blank, a transfer mask and a method of manufacturing the same, may be suitably employed.

1. Mask Blank

1-A) Outline

Figure 1:
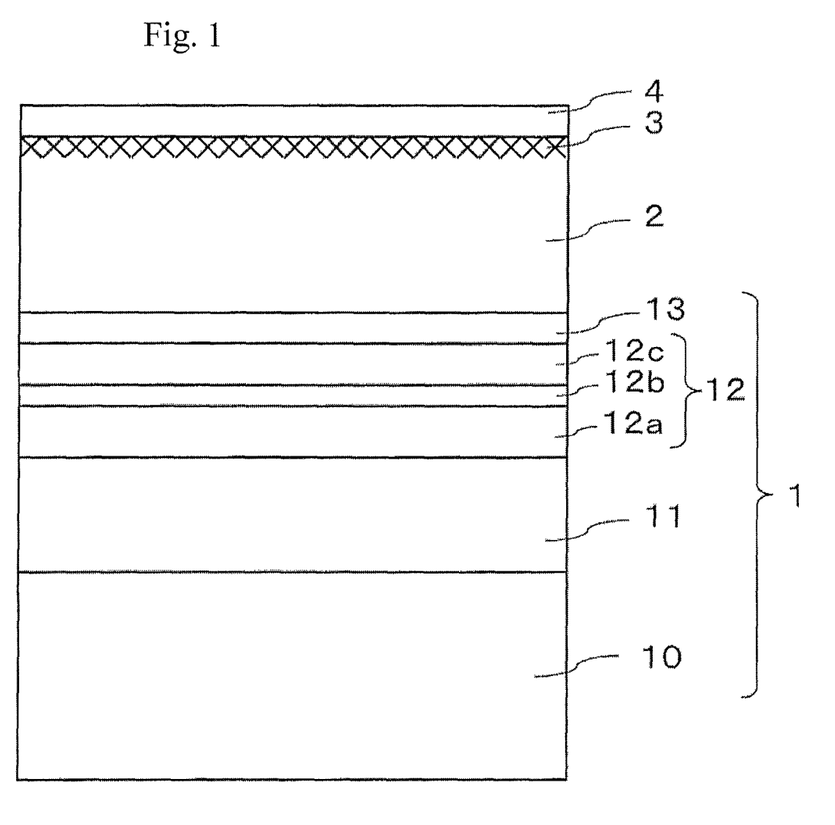
FIG. 1 is a schematic sectional view of a binary mask blank according to an embodiment of the present invention.

The mask blank of this embodiment will be described using FIGS. 1 to 3.

The mask blank of this embodiment has the following constitution roughly.

Substratum 1 which is a base of the mask blank

Chemically amplified resist layer 2 formed by a chemically amplified resist (simply called a "resist layer 2" hereafter.)

Buffer layer 3 which is the buffer layer 3 formed so as to coat the resist layer 2, and configured to keep pH balance between the resist layer 2 and the protective layer 4, while not allowing acid or base to be excessively directed to the resist layer 2 from the protective layer 4.

Protective layer 4 formed so as to coat the resist layer 2 (more specifically buffer layer 3)

Note that a description order shows a stacking order. In other words, when viewed from a vertical direction, the resist layer 2 is stacked from a sky direction viewed from the substratum 1, and the buffer layer 3 is stacked from the sky direction viewed from the resist layer 2.

1-B) Substratum 1

A substratum including the substrate 10, which is the mask blank of patent document 1, in a stage before forming the resist layer 2, may be used as the substratum 1 of this embodiment. The substrate 10 itself may be used as the substratum 1, or a light semi-transmitting film 11 or a light shielding film 12, or an etching mask 13 (hard mask) or an antireflective film, etc., may be formed on the substrate 10. Further, the substrate 10 made of a quartz glass may be used as the substrate 10.

The content described in patent document 1 or a publicly-known content may be employed for a specific composition of each kind of film or layer. As an example, MoSiN film is used as the light semi-transmitting film 11, and a plurality of chromium compound-containing films such as CrON or CrN may be used as the light shielding film 12, and MoSiN film may be used as an etching mask 13.

The substrate 10 and the thin film 15 will be described hereafter in detail.

1-B-1) Substrate 10

A glass substrate can be used as the substrate 10 of this embodiment. In a case of a transmission-type mask, the substrate 10 is selected, which is made of a glass material having a high transmittance to an exposure light when forming a pattern on a wafer. In a case of a reflective mask, a low thermal expansion glass is selected, which is capable of minimizing a thermal expansion of the substrate 10 caused by energy of the exposure light.

Specifically, in a case of the transmission-type mask (for example, binary mask, phase-shift mask and gray-tone mask), a synthetic quartz glass, a soda lime glass, an aluminosilicate glass, a borosilicate glass, and a non-alkali glass, etc., are given as the material of the substrate 10. As a specific example, a synthetic quartz glass having a high transmittance to a light with a wavelength of 300 nm or less, can be preferably used for the substrate 10 of the transfer mask using ArF eximer laser with a wavelength of 193 nm or KrF eximer laser with a wavelength of 254 nm as the exposure light.

Further, in a caser of an EUV mask as a reflective mask, in order to suppress a distortion of a transferred pattern due to a heat during exposure, SiO2-TiO2-based glass can be preferably used for the substrate 10, the SiO2-TiO2-based glass being made of a glass material having a low thermal expansion coefficient in a range of about $0\pm1.0\times10-7/°$ C., and more preferably in a range of about $0\pm0.3\times10-7°$ C.

1-B-2) Thin film

A thin film 15 is formed on the main surface of the substrate 10. An element constituting the thin film formed under the resist film 2 on the main surface of the substrate 10, is selected according to the application of the transfer mask manufactured from the mask blank 5. A specific constitution of the thin film is given for example as following (1) to (5).

(1) Thin Film 15 of the Binary Mask Blank

The thin film 15 of the binary mask blank will be described, with reference to FIG. 1. FIG. 1 is a block diagram of the binary mask blank. When the binary mask blank is fabricated, a thin film having a light shielding film, is formed on a substrate having a light-transmitting property to a light having an exposure wavelength.

The light shielding film 111 is made of a material containing a transition metal alone such as chromium, tantalum, ruthenium, tungsten, titanium, hafnium, molybdenum, nickel, vanadium, zirconium, niobium, palladium, and rhodium, etc., or the compound of them. For example, there is the light shielding film 111 composed of chromium or a chromium compound obtained by adding one or more kinds selected from the elements such as oxygen, nitrogen, and carbon, etc., to chromium. Further, for example, there is the light shielding film 111 composed of a tantalum compound obtained by adding one or more kinds of elements selected from the elements to tantalum.

Further, there is the thin film 15 having a two-layer structure of a light shielding layer and a main surface anti-reflection layer, or a three-layer structure in which a rear surface anti-reflection layer is added between the light shielding layer and the substrate 10, as the structure of the light shielding film 111. Further, the thin film 15 may be a composition gradient film in which a composition in a film thickness direction of the light shielding film 111 is continuously or stepwise different.

Further, the thin film 15 may have a structure having an etching mask 13 on the light shielding film 111. The etching mask 13 is preferably composed of particularly chromium or the chromium compound obtained by adding the elements such as oxygen, nitrogen, and carbon, etc., to chromium, having etching selectivity to the etching applied to the light shielding film 111 containing a transition metal silicide (having etching resistance). At this time, by imparting the anti-reflection function to the etching mask 13, the transfer mask may be fabricated in a state that the etching mask 13 is remained on the light shielding film 111.

(2) Thin Film 15 of the Binary Mask Having Other Structure

Further, as other example of the thin film 15 of the binary mask, there is also a structure having the light shielding film 111 composed of a transition metal and silicon (including transition metal silicide and particularly molybdenum silicide).

The light shielding film 111 is for example made of a material containing the transition metal and the compound of silicon, and mainly composed of these transition metal and silicon, oxygen and/or nitrogen. The light shielding film 111 is for example also made of the material mainly composed of the transition metal, oxygen, nitrogen and/or boron. Molybdenum, tantalum, tungsten, titanium, hafnium, nickel, vanadium, zirconium, niobium, palladium, ruthenium, rhodium, chromium and the like are applicable to the transition metal.

Particularly, there is a two-layer structure of a light shielding layer (such as MoSi, etc.) and a main surface anti-reflection layer (such as MoSiON, etc.) and a three-layer structure in which a rear surface antireflection layer (such as MoSiON, etc.) is added between the light shielding layer and the substrate 10, when the light shielding film 111 is made of a compound of molybdenum silicide.

Further, the light shielding film 111 may be a composition gradient film in which a composition in a film thickness direction of the light shielding film 111 is continuously or stepwise different.

(3) Thin Film 15 of a Half-Tone Phase Shift Mask

Figure 2:
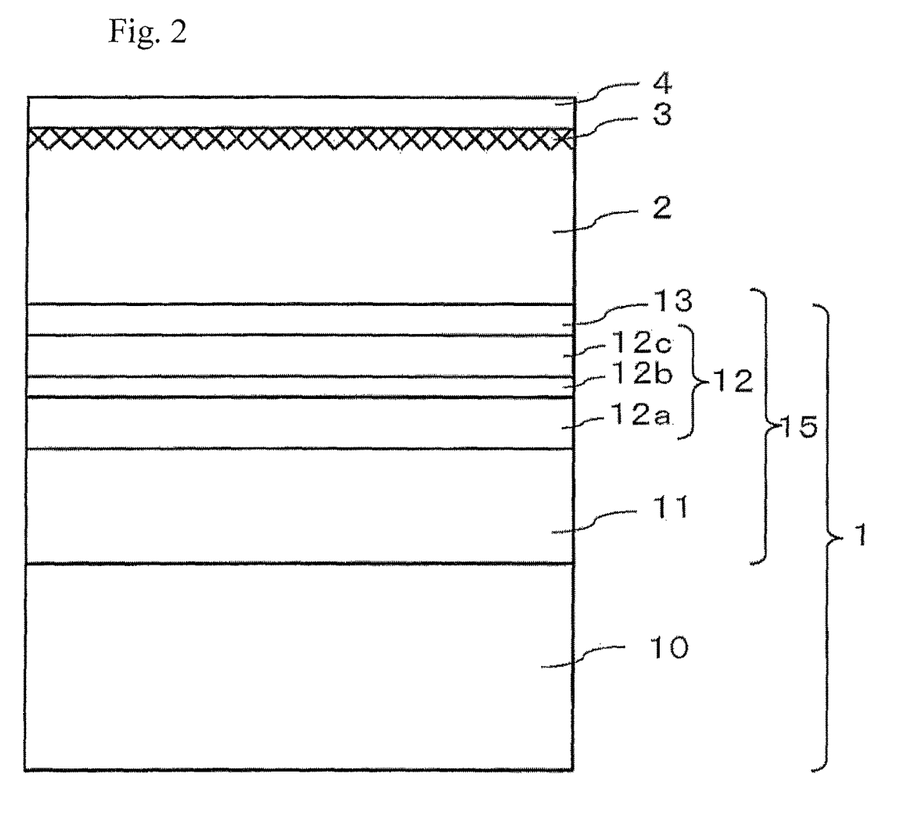
FIG. 2 is a schematic sectional view of a light semi-transmission type phase shift mask blank according to an embodiment of the present invention.
Figure 3:
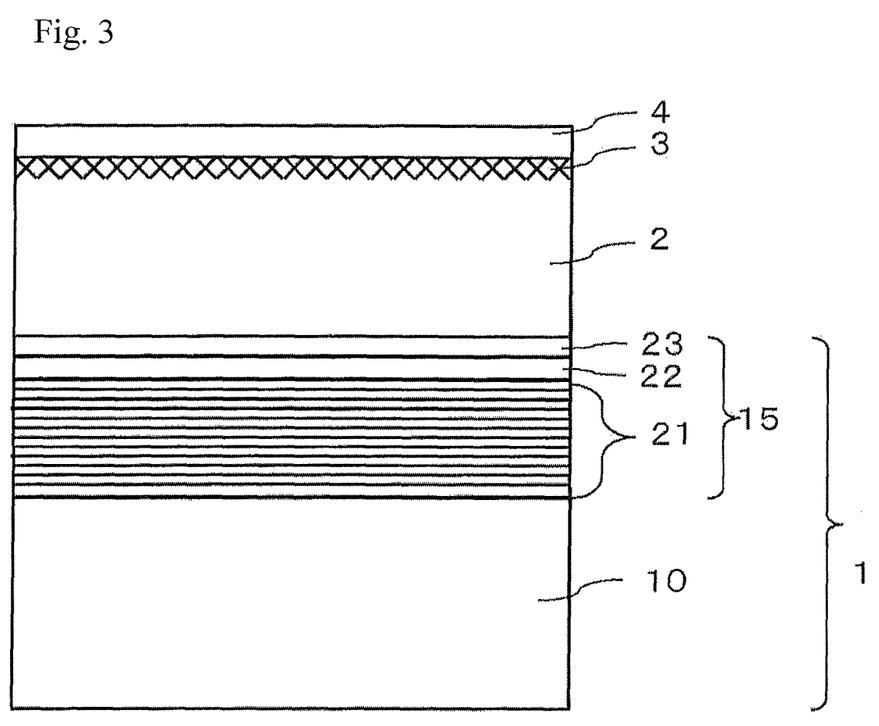
FIG. 3 is a schematic sectional view of a reflective mask blank according to an embodiment of the present invention.

FIG. 2 is a block diagram of a half-tone phase shift mask. When the half-tone phase shift mask is fabricated, the thin film 15 is formed on the substrate 10 having a light transmitting property to the light having an exposure wavelength used during transfer, the thin film 15 having a light semi-transmitting film 11 made of a material containing the transition metal and silicon (including transition metal silicide, and particularly molybdenum silicide).

The light semi-transmitting film 11 included in the thin film 15 allows a light (for example, 1% to 30% of the exposure wavelength) having an intensity of not substantially contributing to the exposure, to be transmitted, and has a prescribed phase difference (for example, 180 degrees). In addition, the half-tone phase shift mask is configured so that by a light semi-transmitting part for patterning the light semi-transmitting film 11, and a light transmitting part where the light semi-transmitting film is not formed and transmitting a light having an intensity of substantially contributing to an exposure, a phase of a light transmitted through the light semi-transmitting part is substantially an inverted relation to a phase of a light transmitted through the light transmitting part, thereby canceling the lights that pass in the vicinity of a boundary portion between the light semi-transmitting part and the light transmitting part and enter into mutual regions by a diffraction phenomenon, and the light intensity at the boundary portion is set to approximately zero, and a contrast, that is, a resolution of the boundary portion is improved.

The light semi-transmitting film 11 is for example made of a material containing a transition metal and silicon (including transition metal silicide), and mainly composed of the transition metal and silicon, oxygen and/or nitrogen. Molybdenum, tantalum, tungsten, titanium, hafnium, nickel, vanadium, zirconium, niobium, palladium, ruthenium, rhodium, and chromium, etc., are applicable to the transition metal.

Further, when there is the light-shielding film 12 on the light semi-transmitting film 11, the light-shielding film 12 is preferably composed of particularly chromium or the chromium compound obtained by adding the elements such as oxygen, nitrogen, and carbon, etc., to chromium, having etching selectivity to the light semi-transmitting film 11 (having etching resistance), as the material of the light-shielding film 12, because the material of the light semi-transmitting film 11 contains the transition metal and silicon.

(4) Thin Film 15 of a Multi-Tone Mask

A thin film 15 of a multi-tone mask has a laminated structure of one or more semi-transmitting films and the light-shielding film 12.

The material of the semi-transmitting film includes a metal single body such as chromium, tantalum, titanium, and aluminum, etc., and an alloy or a compound of them, in addition to an element similar to the element of the light semi-transmitting film 11 of the halftone phase shift mask blank.

A composition ratio of a film thickness of each element is adjusted so as to be a prescribed transmittance to the exposure light. The light-shielding film 12 of the binary mask blank is also applicable to the material of the light-shielding film 111, and the composition and the film thickness of the light-shielding film 12 are adjusted so as to have a prescribed light-shielding performance (optical density) in the lamination structure with the semi-transmitting film.

(5) Thin Film 15 of a Reflective Mask

The thin film 15 of the reflective mask blank (EUV mask blank) will be described, with reference to FIG. 3. FIG. 3 is a block diagram of the reflective mask blank.

The thin film 15 of the reflective mask blank has a structure in which a multilayer reflective film 21 is formed on the substrate 10 made of a glass material having a low thermal expansion coefficient for reflecting the exposure light, and a protective film 22 (capping layer) is formed on the multilayer reflective film 21, and an absorber film 23 is formed on the protective film 22 for absorbing the exposure light.

The reflective mask manufactured from the reflective mask blank has a structure in which the absorber film 23 is formed in a pattern shape for absorbing the exposure light, and the light (EUV light) incident on the reflective mask mounted on an exposure machine (pattern transfer device) is absorbed at a portion where the absorber film 23 is present, and a light image reflected by the multilayer reflective film 21 is transferred on a semiconductor substrate through a reflection optical system at a portion where the absorber film is not present.

The multilayer reflective film 21 is formed by alternately laminating a high refractive layer and a low refractive layer. As an example of the multilayer reflective film 21, there are Mo/Si cycle laminated film in which Mo film and Si film are alternately laminated by about 40 cycles, Ru/Si cycle multilayer film, Mo/Be cycle multilayer film, Mo compound/Si compound cycle multilayer film, Si/Nb cycle multilayer film, Si/Mo/Ru cycle multilayer film, Si/Mo/Ru/Mo cycle multilayer film, and Si/Ru/Mo/Ru cycle multilayer film, etc. The material can be suitably selected depending on the exposure wavelength.

The protective film 22 (capping layer) is the film of protecting the multilayer reflective film 21, and is composed of Ru for example.

Further, the absorber film 23 has a function of absorbing EUV light for example, which is an exposure light, and for example, a material mainly composed of tantalum (Ta) alone or Ta can be preferably used. Preferably, a crystal state of such an absorber film 23 has an amorphous state or a microcrystalline state, in terms of smoothness and flatness.

1-C) Chemically Amplified Resist Layer 2

There are various limits in the chemically amplified resist used for forming the resist layer 2 of this embodiment. The resist layer 2 of this embodiment is required to have an important role of receiving salt, etc., from the protective layer 4. However, the kind of a usable chemically amplified resist layer is changed, depending on the salt received from the protective layer 4, (namely, depending on the kind of the acidic substance and basic substance of the protective layer 4). That is, there is an affinity for forming the buffer layer 3 between the resist layer 2 and the protective layer 4.

Such an affinity will be described in the following 1-D) Buffer layer 3 and 1-E) Protective layer 4. If the abovementioned affinity is satisfied, a publicly-known resist may be used as the kind of the chemically amplified resist.

1-D) Buffer Layer 3

The buffer layer 3 of this embodiment has a portion where a pre-coated resist layer 20 and the protective layer 4 are in contact with each other, which is a surface layer portion of the pre-coated resist layer 20 before being coated by the protective layer 4. This portion is formed by receiving the salt moved from the protective layer 4 or the acidic substance and the basic substance which are the base of the salt (they are called "salt, etc." hereafter).

From a viewpoint of a composition, the buffer layer 3 is the layer in which there is a coexistence of a component contained in the protective layer 4 and a component contained in the resist layer 2. Regarding the coexistence state specifically, it can be considered as follows.

1. First, the protective layer 4 containing the acidic substance and the basic substance is used in this embodiment.

2. Salt is generated by a reaction between the acidic substance and the basic substance in the protective layer 4.

3. The surface layer portion of the pre-coated resist layer 20 receives the salt, an unreacted acidic substance and an unreacted basic substance, respectively.

4. Finally, the surface layer portion of the pre-coated resist layer 20 is the layer in a coexistence state of the component contained in the protective layer 4 and the component contained in the resist layer 2.

The "pre-coated resist layer 20" called here, is the resist layer 2 before the protective layer 4 is coated (namely, before the buffer layer 3 is formed) as its name suggests. After the protective layer 4 is coated, the surface layer portion of the pre-coated resist layer 20 is changed to the buffer layer 3. Therefore, the "resist layer 2" described hereafter indicates a portion not changed to the buffer layer 3 in the pre-coated resist layer 20. Namely, the "pre-coated resist layer 20" is composed of "a portion scheduled to be the buffer layer 3, having the salt of the protective layer 4 enter thereinto" and "a portion scheduled to be the resist layer 2, with the salt, etc., of the protective layer 4 not enter thereinto".

As described above, by intentionally receiving the salt, etc., from the protective layer 4 into the surface layer portion of the pre-coated resist layer 20, a system of chemical equilibrium is formed to generate a buffering action by an acid-base reaction between the salt, the acidic substance, and the basic substance, and finally pH balance is kept between the resist layer 2 and the protective layer 4 while not allowing the acid or base to be excessively directed to the resist layer 2 from the protective layer 4.

As a mechanism of exhibiting the abovementioned effect, it can be considered that due to a coexistence of a prescribed amount of the component, etc., of a main polymer contained in the resist layer 2, and the salt received from the protective layer 4, the system of the chemical equilibrium is formed by a salt-generating reaction between the salt, the acidic substance, and the basic substance, thus providing a buffer zone between the resist layer 2 and the protective layer 4. As a result, it can be considered that the buffer layer 3 as the buffer zone, has a structure of not allowing the basic component contained in the protective layer 4 to permeate toward the resist.

By providing the buffer layer 3 between the resist layer 2 and the protective layer 4, all points described in the problem of the invention, can be solved.

Specifically, by providing the protective layer 4, a first point (foreign matter adhered to an outermost surface of the mask blank) and a second point (deterioration of the chemically amplified resist when brought into contact with the outside air) can be solved.

Then, as a third point, the following point can be given. That is, the third point is the point that when the protective layer 4 (another layer) is formed on the resist layer 2, the sensitivity of the resist layer 2 is reduced, due to acidic or basic component contained in the protective layer 4, or a moisture or an outgas permeated through the protective layer 4. However, as described in this embodiment, by providing the buffer layer 3 using the pre-coated resist layer 20 and the protective layer 4, it is also possible to provide the buffer zone as a result between the resist layer 2 and the protective layer 4, against the acidic or basic component contained in the protective layer 4, or the moisture or the outgas permeated through the protective layer 4.

Further, as a fourth point, there is a necessity for maintaining a high adhesion between the resist layer 2 and the protective layer 4. However, as described in this embodiment, by providing the buffer layer 3 between the resist layer 2 and the protective layer 4, the fourth point can also be solved. The reason is as follows.

As described above, the surface layer portion of the pre-coated resist layer 20 is in a coexistence state of the component contained in the protective layer 4 and the component contained in the resist layer 2. This also means that the resist layer 2 and the protective layer 4 are fused at an interface between both layers. Then, the adhesion between the resist layer 2 and the protective layer 4 are remarkably improved, compared to a case that the resist layer 2 does not receive the salt, etc., contained in the protective layer 4.

Further, as a fifth point, when exposure is performed to the resist layer 2, there is a possibility that a property of the exposed portion on the main surface of the resist layer 2 is changed. However, as described in this embodiment, by providing the buffer layer 3 between the resist layer 2 and the protective layer 4, the fifth point is also solved. The reason is as follows.

First, as described in the item of the problem of the invention, a spot exposure of several tens nm diameter is performed to a positive type chemically amplified resist, and such a case is taken into consideration. The resist is hydrophobic, and therefore a developing solution does not enter satisfactorily into the exposed portion which is a spot of several tens nm diameter, thus making it difficult to form a fine resist pattern.

On the other hand, if the above case is replaced with the case of this embodiment, the exposed portion of the resist layer 2 is removed together with the protective layer 4 by the developing solution. At this time, the buffer layer 3 is also removed to some extent together with a removal of the protective layer 4. This is because the buffer layer 3 is the layer in a coexistence state of the component contained in the protective layer 4 and the component contained in the resist layer 2, and in a virtually exposed state, thus improving the solubility and removing the buffer layer 3.

Here, the removal of the buffer layer 3 means the removal of the surface layer portion of the pre-coated resist layer 20. That is, difficulty of the exposed portion to enter into the developing solution under influence of the main surface of the pre-coated resist layer 20, can be eliminated by removing the surface layer portion of the pre-coated resist layer 20 (by removing the buffer layer 3). In addition, since the exposed part of the resist layer 2 is removed by the developing solution together with the protective layer 4, and therefore wettability of the resist layer 2 is improved. As a result, it is possible to eliminate a phenomenon such that the developing solution does not enter into the exposed portion on the main surface of the resist layer 2, like a conventional example described above.

Incidentally, in order to satisfactorily coat the base material 1 with the chemically amplified resist, a surfactant is added to the chemically amplified resist. After the resist layer 2 is formed and before the protective layer 4 is formed, it can be considered that a lot of surfactants exist on the outermost surface of the resist layer 2 in terms of a surface tension. Therefore, conventionally, even if the protective layer 4 is provided to coat the resist layer 2, the surfactant still exists between both layers. As a result, there is a possibility that the adhesion between the resist layer and the protective layer 4 is reduced. More unpreferably, even if the resist layer 2 is coated with the developing solution after removing the protective layer 4, there is a possibility that the developing solution does not reach the exposed portion due to the surfactant.

However, as described in this embodiment, when the surface layer portion of the pre-coated resist layer 20 is removed in the form of removing the buffer layer 3, the surface layer portion can be removed together with the surfactant that exists on the outermost surface of the resist layer 2.

In any case, as a result of using the technique of this embodiment, the exposed portion can exhibit a faster dissolution rate than an unexposed portion as usual, due to the developing solution. Then, even in a case of the exposed portion which is a spot of several tens nm diameter, the fine resist pattern can be formed.

The buffer layer is preferably soluble in either one of the water and the alkaline aqueous solution or both of them. This is because in either case of the water and the alkaline solution, handling is easy and a cost is low.

The thickness of the buffer layer 3 is preferably 0.1 nm or more and 10 nm or less. If the thickness is 0.1 nm or more, the buffer layer 3 can exhibit the abovementioned function. If the thickness of 10 nm or less, this is a state in which the salt, etc., does not excessively enter into the pre-coated resist layer 20, and there is no adverse influence on the formation of the resist pattern when manufacturing a transfer mask. Although the thickness of the buffer layer 3 is preferably 10 nm or less, the thickness is further preferably 5 nm or less and more preferably 1 nm.

As a method of confirming the buffer layer 3, the buffer layer 3 may be specified using a publicly-known composition analysis method (XPS, etc.). At this time, the thickness of the buffer layer 3 may be obtained.

As a method of obtaining the thickness of the buffer layer 3, there is a method of regarding a difference between a reduced film amount when developing is performed to the resist layer 2 in the case of not providing the buffer layer 3, and a reduced film amount when developing is performed to the resist layer 2 in the case of providing the buffer layer 3, as the thickness of the buffer layer 3. As described above, film reduction of the buffer layer 3 easily occurs due to the developing solution, irrespective of the exposed portion and the unexposed portion, because the component such as salt, etc., of the protective layer 4 enters into the buffer layer 3. Namely, the difference between the reduced film amounts is the reduced film amount caused by providing the buffer layer 3, and consequently, this is the reduced film amount of the buffer layer 3. As a result, the difference between the reduce film amounts may be the thickness of the buffer layer 3.

A measurement method using the abovementioned reduced film amounts is also called a "film reduction method".

1-E) Protective Layer 4

As described above, the protective layer 4 of this embodiment is also a supply source of salt, etc., for not only protecting the main surface of the mask blank from the foreign matters, but also forming the buffer layer 3. What kind of salt, etc., is used for forming the buffer layer when entering into the resist layer 2, is problem of affinity. Although such an affinity is currently under consideration, the content grasped by the inventors of the present invention is as follows.

First, the resist layer 2 is preferably in a state of containing the basic substance, and in a state that the basic substance of the protective layer 4 is more bulky than the basic substance of the resist layer 2. The "bulk" in this embodiment shows a state in which a constituent unit of the end of a molecule spreads three-dimensionally due to a hard substituent, etc., thus preventing an array with other molecule or a rotary motion in the molecule. Further, the "bulk" in this embodiment is specifically an index showing a van der Waals volume of the substituent on α carbon, not uniquely defined by a molecular weight, and having a branching structure like a t-butyl group.

As described above, the salt that enters from the protective layer 4 is generated as a reaction between the acidic substance and the basic substance. Therefore, the salt includes the basic substance as a part of its structure. Accordingly, when the basic substance of the protective layer 4 is more bulky than the basic substance of the resist layer 2, it is possible to prevent the salt which is a part of the structure of the basic substance of the protective layer 4, from entering into an entire body of the pre-coated resist layer 20. Even if the buffer layer 3 works effectively, the role of the resist layer 2 cannot be sufficiently exhibited if the entire body of the pre-coated resist layer 20 becomes the buffer layer 3. In order to prevent such a state, the bulk of the basic substance is defined as described above. Further, by complying with the abovementioned definition of the bulk, it is possible to prevent the basic substance that is free in the basic substance without forming the salt, from excessively entering into the resist layer 2.

The bulk of the basic substance may be examined by a publicly-known method, and mass spectrometry or chromatography, Fourier transform infrared spectroscopy, and X-ray diffraction method, etc., may be used.

Further, the resist layer 2 may be preferably set in a basic substance-containing state so that a molecule of the basic substance of the protective layer 4 is larger than a molecule of the basic substance of the resist layer 2. This is because a similar effect as the abovementioned definition of the bulk can be exhibited.

The "molecule is large" here means a magnitude of a literal "molecular size". It is a matter of course that such a size of the molecule may be set using the above-listed publicly-known methods. Further, as an example of a simple method, both basic substances are compared as a molecular weight, and a larger molecular weight may be regarded as a large molecule.

As a suitable example, the basic substance of the resist layer 2 is preferably a lower amine, and the basic substance of the protective layer 4 is preferably a higher amine.

Also, the acidic substance of the protective layer 4 is preferably an aromatic compound, and particularly preferably a polyaniline-based resin. Polyaniline-based resin may have an acidic substituent of the sulfo-group into a benzene ring. Since electrical conductivity is improved by containing the acidic group-substituted aniline such as amino benzene sulfone as the component of the protective layer, charge-up at the time of drawing with an electron beam is effectively prevented in a case of an electron beam lithography-type resist. Also, the basic substance of the protective layer 4 is preferably amine, and specifically is preferably tetra alkyl ammonium hydride-based quaternary ammonium salt. Further preferably, both of them are combined as a constituent of the protective layer 4. In this case, the protective layer 4 is mainly composed of polyaniline-based resin. With this structure, the protective layer 4 serves as a water-soluble polymer, and the protective layer 4 can be easily removed when removing the protective layer 4 prior to development. The main component referred to herein, refers to a component present by more than 50% in the composition ratio. At this time, the basic substance of the resist layer 2 is preferably tetra-butyl amine.

Similarly to the buffer layer 3, the protective layer 4 is preferably soluble in either or both of water and alkaline aqueous solution.

1-F) Others

With the abovementioned structure, the other publicly-known layer (film) may be provided on the mask blank. For example, a layer other than the abovementioned layer may be added to the substratum 1, or another layer may be provided so as to coat the protective layer 4.

2. Method of Manufacturing a Mask Blank

Figure 4:
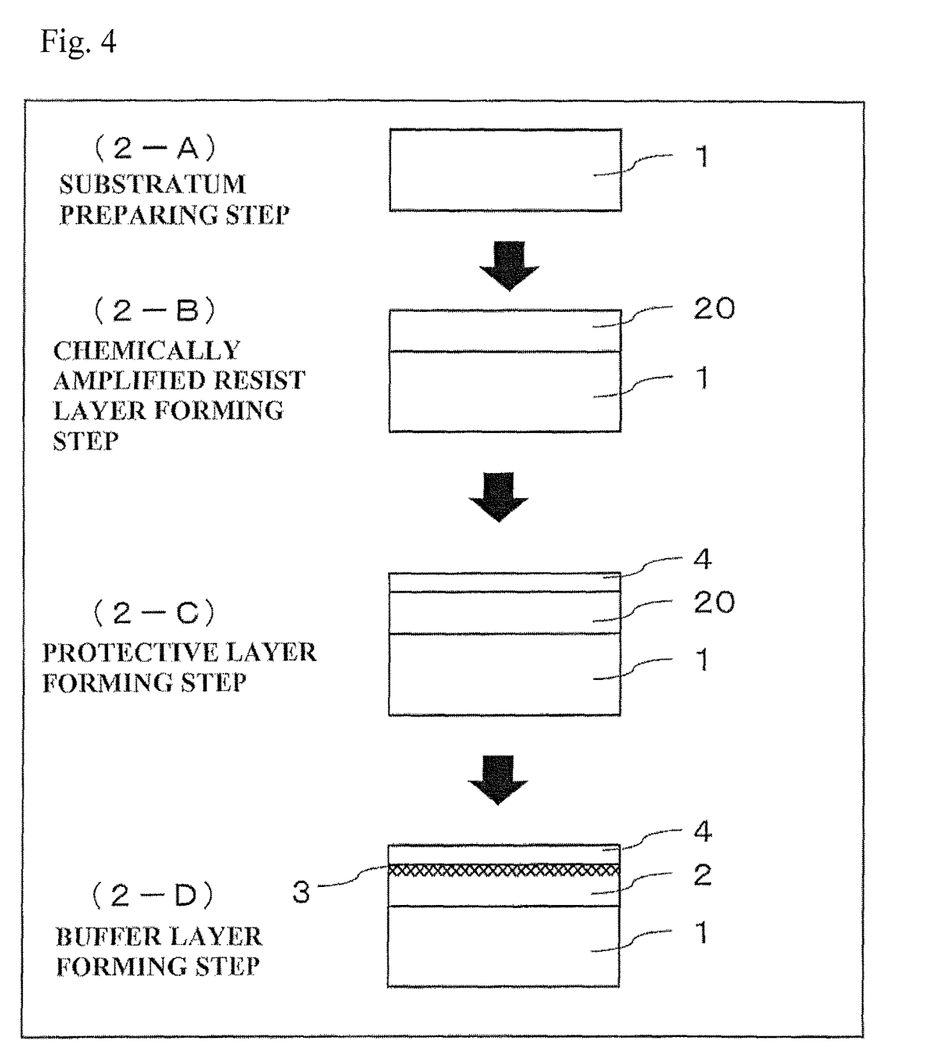
FIG. 4 is a schematic sectional view showing a procedure of manufacturing a mask blank according to an embodiment of the present invention.

A method of manufacturing a mask blank of this embodiment will be described next, using FIG. 4. FIG. 4 is a schematic cross-sectional view showing the method of manufacturing a mask blank of this embodiment. Note that some of the contents of the following steps are overlapped with the contents described in <1. Mask blank>, and therefore, the contents not described below are the contents described in <1. Mask blank>.

2-A) Substratum Preparing Step

First, a substratum 1 as a base of the mask blank is prepared. A content described in patent document 1 or a publicly-known content may be used as a specific structure and a preparation method. In this embodiment, a light semi-transmitting film 11, a light shielding film 12, and a thin film 15 such as an etching mask 13, etc., are provided on the substrate 10 which is composed of a quartz glass, and such a case is described.

2-B) Chemically Amplified Resist Layer Forming Step

In this step, the resist layer 2 is formed by a chemically amplified resist to coat the substratum 1. As a specific method, the content described in patent document 1 or a publicly-known method may be used. As an example, HMDS treatment is applied to the main surface of the substratum 1, and thereafter the main surface of the substratum 1 is coated with chemically amplified resist by spin coating, and bake treatment is applied thereto. Thus, the resist layer 2 is formed so as to coat the substratum 1.

2-C) Protective Layer Forming Step

In this step, the protective layer 4 is formed so as to coat the resist layer 2. As a specific method, the content described in patent document 1 or a publicly-known method may be used. As a specific method, the content described in patent document 1 or a publicly-known method may be used. As an example, the main surface of the resist layer 2 is coated with a chemical agent which is a raw material of the protective layer 4, and bake treatment is applied thereto.

As described above, the acidic substance that exists in the protective layer 4, is reacted with the basic substance that similarly exists in the protective layer 4, to thereby generate the salt. The protective layer 4 contains the salt. As a specific example of the chemical agent (coating liquid) which is the raw material of the protective layer 4, the coating liquid containing 90 mass % or more water is preferable when the acidic substance is polyaniline and the basic substance is amine. Thus, the salt is not allowed to excessively exist in the protective layer 4, and the buffer layer 3 having a suitable thickness can be formed. Further, even if the basic substance is contained in both of the resist layer 2 and the protective layer 4, the basic substance contained in the protective layer 4 can be thinner than the basic substance contained in the resist layer 2 composed of the chemically amplified resist, by containing 90 mass % or more water in the basic substance. Then, by utilizing the difference of concentration, the basic substance in the protective layer 4 is not allowed to permeate into the buffer layer 3 and the resist layer 2 which is deeper than the buffer layer 3.

2-D) Buffer Layer Forming Step

In this step, during or after the protective layer forming step, the salt, etc., (namely, the acidic substance, the basic substance, and the salt) which is moved from the protective layer 4, is received by a surface layer portion of the pre-coated resist layer 20 before being coated with the protective layer 4, which is the portion where the pre-coated resist layer 20 and the protective layer 4 are in contact with each other. Thus, the buffer layer 3 is formed between the resist layer 2 and the protective layer 4.

A specific method will be described. When the buffer forming step is performed during the protective layer forming step, the surface layer portion of the pre-coated resist layer 20 receives the salt, etc., that moves from the protective layer 4, during bake treatment in the protective layer forming step. Further, when the buffer layer forming step is performed after the protective layer forming step, the surface layer portion of the pre-coated resist layer 20 receives the salt, etc., that moves from the protective layer 4, when a temperature is lowered to a room temperature after the bake treatment in the protective layer forming step.

A mechanism of forming the buffer layer 3, albeit at guessing, includes the following argument. When the basic substance of the pre-coated resist layer 20 and the basic substance of the protective layer 4 are the compounds of the same type (for example, both are amine), both basic substances are easily mixed each other because they are both amines. However, if the coating liquid is thinned as described above, the basic substance in the protective layer 4 is hardly permeated into the pre-coated resist layer 20. As a result, a portion where both basic substances gather, is formed between the pre-coated resist layer 20 and the protective layer 4. Among them, the pre-coated resist layer 20 receives a main basic substance (ie. salt in which amine is bound to polyaniline) of the protective layer 4. Then, un-reacted acidic substance and un-reacted basic substance are also received, and a chemical equilibrium is formed. As a result, the surface layer portion of the pre-coated resist layer 20 is changed to the buffer layer 3.

However, the abovementioned contents are merely speculation, and the inventors of the present invention are under extensive consideration for more information.

By suitably performing other processing such as washing after passing through the above steps, the mask blank of this embodiment is manufactured.

3. Transfer Mask and a Method of Manufacturing the Same

Figure 5:
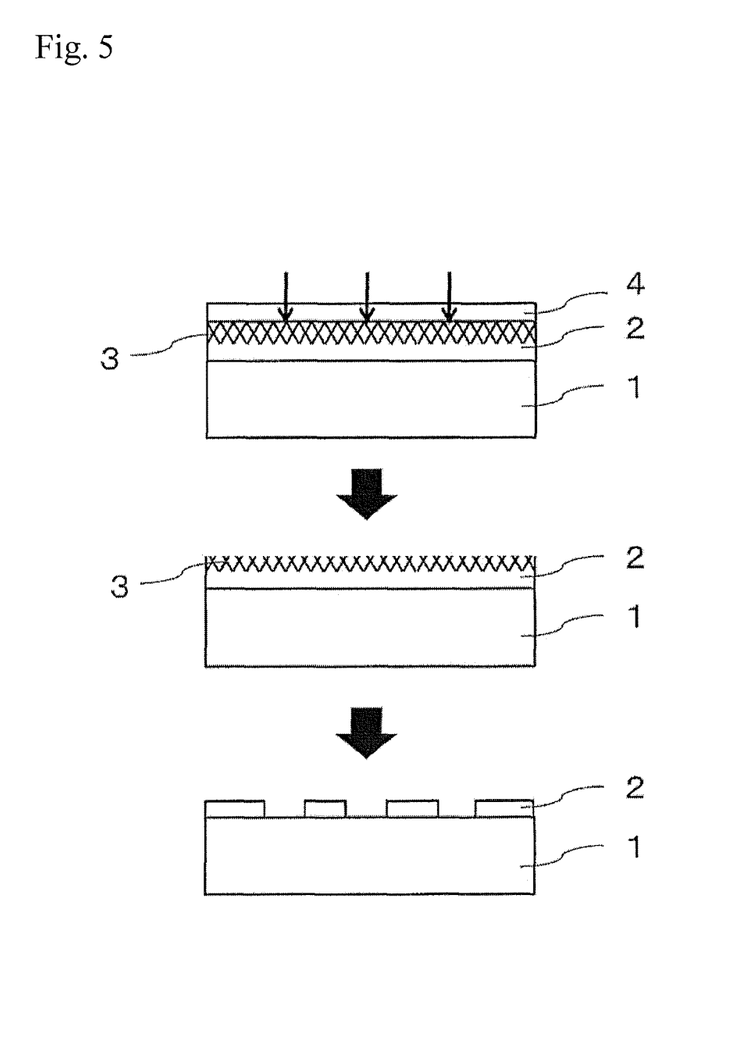
FIG. 5 is a schematic sectional view showing a procedure of manufacturing a transfer mask according to an embodiment of the present invention.

A transfer mask and a method of manufacturing the same of this embodiment will be described next, using FIG. 5. FIG. 5 is a schematic cross-sectional view showing the method of manufacturing a transfer mask according to this embodiment. The contents of the method of manufacturing a transfer mask of this embodiment are as follows.

Exposure corresponding to a shape of a prescribed pattern is performed to the mask blank manufactured by the above <2. Method of manufacturing a mask blank>, and thereafter pattern forming step is performed for forming a resist pattern by development, and finally, the substratum 1 or the substrate 10 having a prescribed uneven pattern is manufactured. Note that the pattern forming step called here, may indicate the formation of the resist pattern or more specifically may indicate the formation of the uneven pattern over the substratum 1 or the substrate 10.

Here, the mask blank of this embodiment is configured so that the resist layer 2 is protected from foreign matters by the protective layer 4, and a function as the chemically amplified resist is maintained, and is in a state that a fine pattern can be formed. As a result, by performing exposure and development to the mask blank of this embodiment, the transfer mask having a fine pattern formed thereon can be manufactured. As a size of the pattern, 200 nm or less is preferable. In a case of the method of manufacturing a transfer mask of this embodiment, a fine pattern of 50 nm or less can be stably formed. The shape of the pattern called here, may be an arbitrary shape. For example, the shape may be linear, point-like, or may be a combination of them.

4. Effect of this Embodiment

According to this embodiment, the following effect is exhibited.

The surface layer portion of the pre-coated resist layer 20 is made to intentionally receive the salt, etc., (the salt, and the acidic substance and the basic substance which are bases of the salt) from the protective layer 4. Thus, a chemical equilibrium by an acid-base reaction is formed between the salt, the acidic substance, and the basic substance, to thereby generate a buffer action. As a result, finally, pH balance is kept between the resist layer 2 and the protective layer 4, while not allowing the acid and the base to be excessively directed to the resist layer 2.

More specifically, by providing the protective layer 4, a first point (foreign matter adhered to an outermost surface of the mask blank) and a second point (deterioration of the chemically amplified resist when brought into contact with the outside air) can be solved. As a result, a conventional protective film-attached mask blank can effectively prevent a direct physical impact on the resist layer 2 from outside, or the adhesion of dust to the resist layer 2.

Then, as a third point, by providing the buffer layer 3 utilizing the pre-coated resist layer 20 and the protective layer 4, the buffer zone can be provided as a result, between the resist layer 2 and the protective layer 4, against the component such as acid and base contained in the protective layer 4 or the moisture or the outgas permeated through the protective layer 4. Owing to the existence of the buffer layer 3 as the buffer zone, the buffer layer 3 prevents oxygen, etc., in the atmosphere or the outgas, etc., caused by a containing vessel, from entering into the resist layer 2, even if they permeate through the protective layer 4. As a result, even if the mask blank is stored for a long time in a state that the resist layer 2 is formed, the change of the sensitivity does not occur due to an influence of the gas in the atmosphere. By not allowing the change of sensitivity to occur, there is no necessity for complicating the steps, like a case that the resist layer 2 is formed for the first time immediately before manufacturing the transfer mask (namely, immediately before exposure of the pattern shape).

Further, as a fourth point, the surface layer portion of the pre-coated resist layer 20 is in a coexistence state of the component contained in the protective layer 4 and the component contained in the resist layer 2. This also means that the resist layer 2 and the protective layer 4 are in a fused state at the interface between both layers. Then, the adhesion between the resist layer 2 and the protective layer 4 are remarkably improved, compared to a case that the resist layer 2 does not receive the salt, etc., contained in the protective layer 4.

Further as a fifth point, difficulty of the exposed portion to enter into the developing solution under influence of the main surface of the pre-coated resist layer 20, can be eliminated by removing the surface layer portion of the pre-coated resist layer 20 (by removing the buffer layer 3). As a result, like the conventional example described above, it is possible to eliminate a performance that the developing solution is continued to be adhered to the exposed portion on the main surface of the resist layer 2. Then, consequently as usual, the exposed portion can exhibit a faster dissolving rate than a non-exposed portion, due to the developing solution, and even if a high dose exposure is performed, or even in a case of the exposed portion of a spot of several tens diameter, the fine resist pattern can be formed.

As described above, according to this embodiment, there is provided a mask blank, and a technique related to the mask blank, capable of protecting the resist layer 2 from foreign matters by the protective layer 4, and maintaining a function as the chemically amplified resist, and forming a fine pattern.

5. Modified Example

A technical range of the present invention is not limited to the abovementioned embodiments, and includes various modifications and improvements in a range of deriving a specific effect obtained by the features of the invention and a combination of them.

(Affinity of the raw material of the resist layer 2 and the raw material of the protective layer 4)

In the abovementioned embodiment, the resist layer 2 has the basic substance, and a degree of the entering of the salt into the protective layer 4 is defined, depending on the bulk and the size of the basic substance contained in the protective layer 4. However, this is an example, and there is also a possibility that the degree of the entering of the salt is determined by other substance, not depending on the basic substance precisely. Further, it is better if the buffer layer 3 is formed as a result, in either case of the acidic substance or the basic substance, and using a compound other than the above-listed compounds.

As the basic substance of the protective layer, an amine compound soluble in water and having a relatively bulky structure, can be given. The number of carbon atoms contained in the molecule of the amine compound is preferably 1 to 30. As specific examples, Piperazine, morpholine, pentylamine, dipropylamine, ethylenediamine, 2-heptylamine, 2-aminopyridine, 2-amino ethanol, cyclohexylamine, diisopropylamine, 4-dimethylaminopyridine, 2-dimethylaminoethanol, N,N-diethyl ethylenediamine, N-isopropylethylenediamine, 3-dimethylamino-propionitrile, N,N-dimethylcyclohexylamine, N,N-dimethyl-n-dodecylamine, (S)-(+)-2-amino-1-butanol, N,N-dimethyl-1,3-propane diamine, 2-amino-2-methyl-1,3-propanediol, 2-amino-2-methyl-1,3-propanediol, N, N, N',N'-tetramethylethylenediamine, and N, N, N',N'-tetramethyl-1,3-propanediamine, can be given.

When the basic substance is a quaternary amine, ammonium hydride is preferable. It is preferably an ammonium hydroxide compound represented by the following general formula (1). As R1, R2, R3, and R4 in the formula (1), there are an alkyl group, an alcohol group, and an aryl group having 1 to 7 carbon atoms. Specifically, tetramethylammonium hydride, ethyl trimethyl ammonium hydride, tetraethyl ammonium hydride, tri-ethyl-butyl ammonium hydride, tri-butyl ethyl ammonium hydride, tetra-n-butyl ammonium hydride, tetra-s-butyl ammonium hydride, and tetra-t-butyl ammonium hydride, can be given.

[Chemical formula 1]

(1)

Further, as the acidic substance of the protective layer 4, there are organic acids having an acid group such as a carboxy-group and a sulfo-group, regardless of an aromatic group and an aliphatic group. As the acidic substance having the carboxyl group, saturated fatty acids, unsaturated fatty acids, and aromatic fatty acids, etc., can be given. Also, as organic acids having the sulfo-group, there are benzene sulfonic acids, alkyl benzene sulfonic acids, amino benzene sulfonic acids, and alkyl-substituted amino benzene sulfonic acids, etc.

EXAMPLE

The present invention will be specifically described next, based on examples. It is a matter of course that the present invention is not limited to the following examples.

The protective layer 4 was provided in the following examples, and meanwhile the protective layer 4 was not provided in comparative examples.

Further, a positive-type resist was used in example 1 (and comparative example 1), and a negative-type resist was used in example 2 (and comparative example 2).

Example 1

2-A) Substratum Preparing Step

In this example, the substratum 1 was fabricated as a lamination body of the light semi-transmitting film 11, the light shielding film 12, and the etching mask 13 provided in a lamination order. In this example, the structure of FIG. 2 was employed.

First, the light semi-transmitting film 11 was formed on the substrate 10 composed of the quartz glass and having a light transmitting property, using a single-wafer DC sputtering apparatus. The light semi-transmitting film 11 was formed as a MoSiN film of a single layer having a film thickness of 69 nm and mainly composed of Mo, Si, and N. Conditions at this time are as follows.

A mixed target (atomic % ratio: Mo:Si=10:90) of molybdenum (Mo) and silicon (Si) was used for a sputter target, and a power of DC source was set to 2.8 kW in a mixed gas atmosphere of argon (Ar), nitrogen ($N_2$), and helium (He) (gas pressure: 0.3 pa, gas flow ratio Ar:$N_2$:He=5:49:46), and a reactive sputtering (DC sputtering) was performed. After sputtering, heat treatment (annealing) was performed for 5 minutes at 250° C.

The light semi-transmitting film 11 is also a phase shift film for ArF excimer laser (wavelength of 193 nm). The phase shift film had a transmittance of 5.24%, and a phase difference of 173.85 degrees measured by the ArF excimer laser (wavelength of 193 nm).

Thereafter, the light shielding film 12 was formed on the light semi-transmitting film 11, using the single-wafer DC sputtering apparatus. The light shielding film 12 has a three-layer structure as follows.

First, CrOCN layer having a film thickness of 30 nm was formed as a first light shielding film 12a. Conditions at this time were as follows.

A chromium target was used for a sputter target, and a power of DC source was set to 1.7 kW in a mixed gas atmosphere of argon (Ar), carbon dioxide, nitrogen, and helium (He) (gas pressure: 0.2 pa, gas flow ratio Ar $CO_2$:$N_2$:He=22:39:6:33), and a reactive sputtering (DC sputtering) was performed.

Next, CrN layer having a film thickness of 4 nm was formed as a second light shielding film 12b. Conditions at this time were as follows.

A chromium target was used, and a power of DC source was set to 1.7 kW in a mixed gas atmosphere of argon and nitrogen, (gas pressure: 0.1 pa, gas flow ratio Ar:$N_2$=83:17), and a reactive sputtering (DC sputtering) was performed.

Finally, CrOCN layer having a film thickness of 14 nm was formed as a third light shielding film 12c. Conditions at this time were as follows.

A chromium target was used, and a power of DC source was set to 1.8 kW in a mixed gas atmosphere of argon (Ar), carbon dioxide, nitrogen, and helium (gas pressure: 0.2 pa, gas flow ratio Ar:$CO_2$:$N_2$:He=21:37:11:31), and a reactive sputtering (DC sputtering) was performed.

Through the abovementioned steps, the light shielding film 12 having a total film thickness of 48 nm was formed. The light shielding film 12 and the phase shift film had a lamination structure, having an optical density (O.D.) of 3.1 at a wavelength of 193 nm.

Thereafter, the etching mask 13 having a film thickness of 10 nm was formed on the light shielding film 12, using the single-wafer DC sputtering apparatus. The composition of the etching mask 13 was set to Mo: 2.3 atomic %, Si: 56.6 atomic %, and N: 41.1 atomic %. Conditions for forming the etching mask 13 were as follows.

A mixed target (atomic % ratio: Mo:Si=4:96) of molybdenum (Mo) and silicon (Si) was used for a sputter target, and a power of DC source was set to 3.0 kW in a mixed gas atmosphere of argon (Ar), nitrogen ($N_2$), and helium (He) (gas pressure: 0.1 pa, gas flow ratio Ar:$N_2$:He=6:11:16).

Thus, the substratum 1 of this example was fabricated.

2-B) Chemically Amplified Resist Layer Forming Step

HMDS treatment was performed to the surface of the abovementioned substratum 1 under a prescribed condition. Thereafter, the main surface of the substratum 1 was spin-coated with the chemically amplified resist for electron beam lithography (XFP-255HC by Fujifilm Electronic Materials Co., Ltd. which is a positive-type resist). Thereafter, a prescribed heating and drying treatment (bake treatment) was performed using a heating and drying device. The film thickness of the pre-coated resist layer 20 was 120 nm.

2-C) Protective Layer Forming Step

The surface of the resist layer 2 was spin-coated with a chemical agent (coating liquid) which was a raw material of the protective layer 4. In addition, as a solvent in the coating liquid, water and isopropyl alcohol were used. The mass ratio was set to water:IPA=90:10. Aqua save (registered trademark) by Mitsubishi Rayon Co., Ltd. was used as a solute in the coating liquid. At this time, the mass ratio of the solute and the solvent was set to solute:solvent=1 to 3:97 to 99. Thereafter, a prescribed heating and drying treatment (bake treatment) was performed using a heating and drying device. The film thickness of the protective layer 4 was set to 20 nm, 2-D) Buffer Layer Forming Step By allowing the salt, etc., of the protective layer 4 to enter into the surface layer portion of the pre-coated resist layer 20 by the bake treatment in the protective layer forming step, the buffer layer 3 was formed. As a result of obtaining the thickness of the buffer layer 3 using the film reduction method, it was found that the thickness of the buffer layer 3 was 5 nm.

Through the abovementioned steps, the mask blank of this example was fabricated. Then, in this example, this mask blank was stored for 3 months in a resin case at a room temperature. An evaluation test described later was performed to the mask blank stored for 3 months.

Comparative Example 1

In comparative example 1, the protective layer 4 was not provided. Namely, 2-C) Protective layer forming step and 2-D) Buffer layer forming step were not performed. Otherwise is the same as example 1, to thereby fabricate the mask blank of comparative example 1. Then, this mask blank was stored for 3 months in the resin case at a room temperature. The evaluation test described later was performed to the mask blank stored for 3 months.

Reference Example 1

As a reference example, the mask blank was separately fabricated by a similar method as the method of this example, and the following evaluation test was performed without storing the mask blank for 3 months. Namely, the mask blank of reference example 1 shows the mask blank before being deteriorated over time, and it can be said that as the following evaluation result is closer to the reference example 1, reduction of the resist sensitivity can be suppressed.

Although the example is called the "reference example", the mask blank of the reference example 1 is fabricated in conformity to this example, and therefore it is a matter of course that the reference example is a specific example of the present invention.

Evaluation 1

Figure 6:
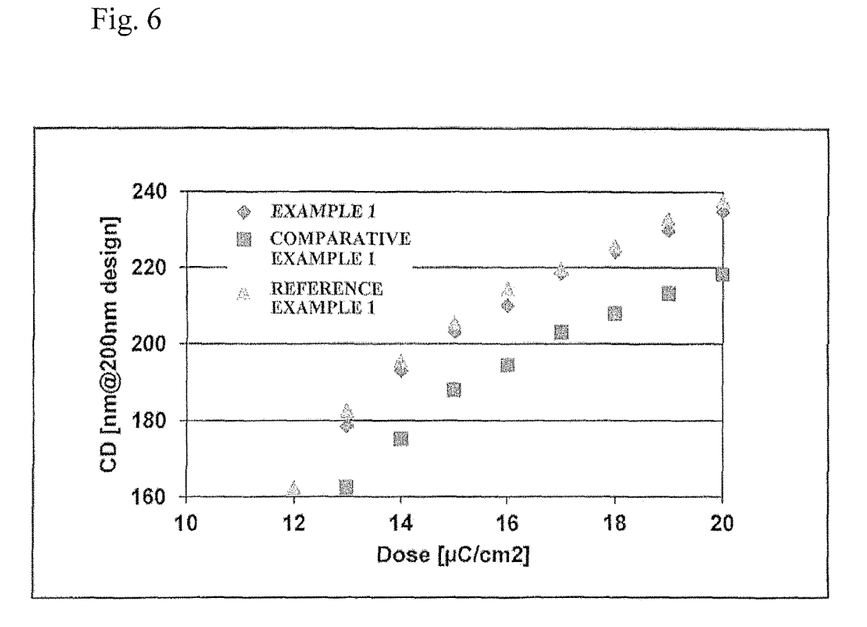
FIG. 6 is a graph showing a result of performing an evaluation to a resist pattern formed from each mask blank fabricated in example 1 and comparative example 1, and is a graph showing a result of performing an evaluation to the resist pattern based on a valued of CD (Critical Dimension) width with respect to Dose.

Exposure by electron beams, bake treatment (called Post Exposure Bake=PEB) at 120° C. after exposure, and development were sequentially performed to each mask blank, to thereby form a resist pattern. Then, evaluation was performed to the resist pattern. The evaluation of the resist pattern was performed based on a value of CD (Critical Dimension) width with respect to Dose. FIG. 6 shows the result. In the measurement of CD, SEM (E3620 by Advantest Corp.) was used.

As shown in the result, it was found that a CD performance with respect to Dose of electron beams of the mask blank of example 1 was higher than the mask blank of comparative example 1. It was also found that the mask blank of example 1 showed almost a similar result as the mask blank of reference example 1. It was also found that this showed that by providing the buffer layer 3 between the resist layer 2 and the protective layer 4 like example 1, reduction of the resist sensitivity was suppressed.

Example 2

In the formation of the resist layer 2 of example 1, the mask blank was fabricated by the same procedure excluding the formation of the negative-type resist layer 2. As the negative-type resist, XFN-003 by Fuji Film Electronics Materials Co., Ltd. was used.

Comparative Example 2

In comparative example 2, the protective layer 4 was not provided. Namely, 2-C) Protective layer forming step and 2-D) Buffer layer forming step were not performed. Otherwise is the same as example 2, to thereby fabricate the mask blank of comparative example 2.

Evaluation 2

Exposure by electron beams, bake treatment (PEB) at 120° C. after exposure, and development were sequentially performed to each mask blank fabricated in example 2 and comparative example 2, to thereby form a resist pattern.

Figure 7:
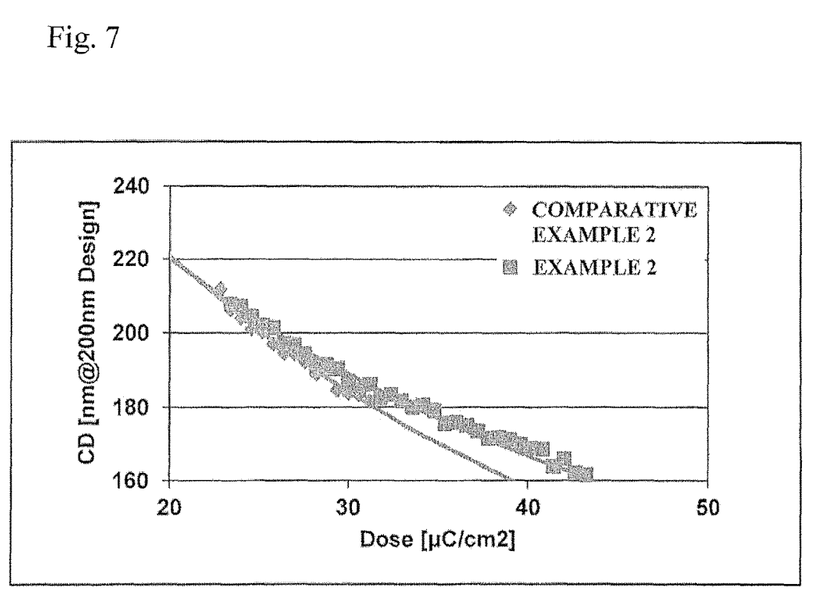
FIG. 7 is a graph showing a result of performing an evaluation to a resist pattern formed from each mask blank fabricated in example 2 and comparative example 2, and is a graph showing a result of performing an evaluation to the resist pattern based on a value of a CD (Critical Dimension) width with respect to Dose.

Evaluation was performed to the resist pattern formed from each mask blank fabricated in example 2 and comparative example 2. The evaluation for the resist pattern was performed based on the value of CD (Critical Dimension) width with respect to Dose. However, since the negative-type resist was used in example 2 and comparative example 2, IS (Isolated Spaces) evaluation was performed as the evaluation of the pattern. FIG. 7 shows the result.

As shown in the result, the mask blank of example 2 was capable of increasing the Dose, and exhibiting an excellent development performance even in a case that the width (space width) of the non-exposed portion was adjusted to 180 nm or less (more specifically about 160 nm).

Meanwhile, the mask blank of comparative example 2 didn't exhibit the excellent performance like example 2. Particularly, when Dose was adjusted to 32 μC/cm$^2$ or more and the space width was adjusted to 180 nm or less, there is generated a phenomenon in which the non-exposed portion was not completely dissolved (the so-called space was not completely missed) during development.

Conclusion

As described above, in this example, it is found that there is provided the mask blank capable of protecting the resist layer 2 from foreign matters by the protective layer 4, and maintaining a function as the chemically amplified resist, and forming a fine pattern.

DESCRIPTION OF SIGNS AND NUMERALS

1 Substratum
10 Substrate
15 Thin film
11 Light semi-transmitting film

12 Light shielding film
12a First light shielding film
12b Second light shielding film
12c Third light shielding film
13 Etching mask
21 Multilayer reflective film
22 Protective film
23 Absorber film
2 Resist layer
3 Buffer layer
4 Protective layer
20 Pre-coated resist layer

The invention claimed is:

1. A mask blank, comprising:
a resist layer formed by a chemically amplified resist;
a protective layer formed to coat the resist layer; and
a buffer layer provided between the resist layer and the protective layer, wherein
the resist layer contains a basic substance,
the protective layer contains an acidic substance, a basic substance, and a salt generated by a reaction between the acidic substance and the basic substance,
the buffer layer has a portion which is a surface layer portion of a pre-coated resist layer before being coated by the protective layer, and in which the pre-coated resist layer and the protective layer are in contact with each other, and this portion contains the acidic substance, the basic substance, and the salt of the protective layer, and
the basic substance of the protective layer is more bulky than the basic substance of the resist layer.

2. The mask blank according to claim 1, wherein the acidic substance of the protective layer is an aromatic compound.

3. The mask blank according to claim 1, wherein the basic substance of the protective layer is amine.

4. The mask blank according to claim 1, wherein a thickness of the buffer layer is 10 nm or less.

5. The mask blank according to claim 1, wherein the protective layer is soluble in one of water or an alkaline solution, or in both of them.

6. The mask blank according to claim 1, wherein the buffer layer is soluble in one of water or an alkaline solution, or in both of them.

7. A method of manufacturing a transfer mask, comprising forming a pattern of a size of 200 nm or less, for the mask blank of claim 1.

8. A method of manufacturing a mask blank, comprising:
forming a protective layer containing an acidic substance, a basic substance, and a salt generated by a reaction between the acidic substance and the basic substance, so as to coat a resist layer formed by a chemically amplified resist, wherein the resist layer contains a basic substance; and
forming a buffer layer between the resist layer and the protective layer by receiving the acidic substance, the basic substance, and the salt moved from the protective layer, at a portion which is a surface layer portion of a pre-coated resist layer before being coated by the protective layer and in which the pre-coated resist layer and the protective layer are in contact with each other, during or after forming the protective layer, wherein the basic substance of the protective layer is more bulky than the basic substance of the resist layer.

9. A mask blank, comprising:
a resist layer formed by a chemically amplified resist;
a protective layer formed to coat the resist layer; and
a buffer layer provided between the resist layer and the protective layer, wherein
the resist layer contains a basic substance,
the protective layer contains an acidic substance, a basic substance, and a salt generated by a reaction between the acidic substance and the basic substance,
the buffer layer has a portion which is a surface layer portion of a pre-coated resist layer before being coated by the protective layer, and in which the pre-coated resist layer and the protective layer are in contact with each other, this portion contains the acidic substance, the basic substance, and the salt of the protective layer, and
a molecule of the basic substance of the protective layer is larger than a molecule of the basic substance of the resist layer.

10. The mask blank according to claim 9, wherein the acidic substance of the protective layer is an aromatic compound.

11. The mask blank according to claim 9, wherein the basic substance of the protective layer is amine.

12. The mask blank according to claim 9, wherein a thickness of the buffer layer is 10 nm or less.

13. The mask blank according to claim 9, wherein the protective layer is soluble in one of water or an alkaline solution, or in both of them.

14. The mask blank according to claim 9, wherein the buffer layer is soluble in one of water or an alkaline solution, or in both of them.

15. A method of manufacturing a transfer mask, comprising forming a pattern of a size of 200 nm or less, for the mask blank of claim 9.

16. A method of manufacturing a mask blank, comprising:
forming a protective layer containing an acidic substance, a basic substance, and a salt generated by a reaction between the acidic substance and the basic substance, so as to coat a resist layer formed by a chemically amplified resist, wherein the resist layer contains a basic substance; and
forming a buffer layer between the resist layer and the protective layer by receiving the acidic substance, the basic substance, and the salt moved from the protective layer, at a portion which is a surface layer portion of a pre-coated resist layer before being coated by the protective layer and in which the pre-coated resist layer and the protective layer are in contact with each other, during or after forming the protective layer, wherein a molecule of the basic substance of the protective layer is larger than a molecule of the basic substance of the resist layer.

* * * * *